(12) United States Patent
Nakai et al.

(10) Patent No.: US 9,494,857 B2
(45) Date of Patent: Nov. 15, 2016

(54) METHOD FOR PRODUCING PRODUCT HAVING UNEVEN MICROSTRUCTURE ON SURFACE THEREOF

(75) Inventors: Yusuke Nakai, Hiroshima (JP); Tetsuya Jigami, Hiroshima (JP); Tadashi Nakamura, Tokyo (JP)

(73) Assignee: MITSUBISHI RAYON CO., LTD., Tokyo (JP)

( * ) Notice: Subject to any disclaimer, the term of this patent is extended or adjusted under 35 U.S.C. 154(b) by 406 days.

(21) Appl. No.: 13/702,307

(22) PCT Filed: Jun. 7, 2011

(86) PCT No.: PCT/JP2011/063018
§ 371 (c)(1),
(2), (4) Date: Dec. 6, 2012

(87) PCT Pub. No.: WO2011/155480
PCT Pub. Date: Dec. 15, 2011

(65) Prior Publication Data
US 2013/0140744 A1    Jun. 6, 2013

(30) Foreign Application Priority Data

Jun. 7, 2010 (JP) .................................. 2010-130367

(51) Int. Cl.
| | |
|---|---|
| *G03F 7/00* | (2006.01) |
| *B29C 33/62* | (2006.01) |
| *B29C 39/14* | (2006.01) |
| *B29C 39/18* | (2006.01) |
| *B29C 43/22* | (2006.01) |
| *B29C 43/28* | (2006.01) |
| *B32B 38/06* | (2006.01) |
| *B29C 59/16* | (2006.01) |
| *B29C 59/04* | (2006.01) |
| *B29C 59/02* | (2006.01) |
| *C08K 5/00* | (2006.01) |
| *B29C 35/08* | (2006.01) |
| *B32B 38/00* | (2006.01) |

(52) U.S. Cl.
CPC ............. *G03F 7/0002* (2013.01); *B29C 33/62* (2013.01); *B29C 39/148* (2013.01); *B29C 39/18* (2013.01); *B29C 43/222* (2013.01); *B29C 43/28* (2013.01); *B29C 59/046* (2013.01); *B29C 59/16* (2013.01); *B32B 38/06* (2013.01); *B29C 35/0805* (2013.01); *B29C 2059/023* (2013.01); *B32B 2038/0076* (2013.01); *C08K 5/0016* (2013.01)

(58) Field of Classification Search
None
See application file for complete search history.

(56) References Cited

U.S. PATENT DOCUMENTS

2010/0109195 A1* 5/2010 Xu et al. .................. 264/293
2010/0243458 A1* 9/2010 Kojima et al. .................. 205/50

FOREIGN PATENT DOCUMENTS

| JP | 2005-156695 | 6/2005 |
| JP | 2007-326367 | 12/2007 |
| WO | WO 0194460 A2 * | 12/2001 |

*Primary Examiner* — Benjamin Schiffman
(74) *Attorney, Agent, or Firm* — Jianq Chyun IP Office

(57) ABSTRACT

A method for producing a product having an uneven microstructure on a surface thereof includes: a step (I) which treats a surface of a roll mold (20) having an uneven microstructure thereon with an external release agent containing a fluorine and not containing a functional group (B) which reacts with a functional group (A) existing on the surface of the product; and a step (II) which obtains the product having the uneven microstructure on the surface thereof (40) by inserting an active energy ray curable resin composition (38) including an internal release agent between the roll mold (20) and a film (substrate) (42) after the step (I). Then, the composition is hardened by being irradiated with an active energy ray and a cured resin layer (44) having a surface, onto which the uneven microstructure is transferred, is formed on the surface of the film (42).

7 Claims, 3 Drawing Sheets

METHOD FOR PRODUCING PRODUCT HAVING UNEVEN MICROSTRUCTURE ON SURFACE THEREOF

CROSS-REFERENCE TO RELATED APPLICATION

This application is a 371 of international application of PCT application serial no. PCT/JP2011/063018, filed on Jun. 7, 2011, which claims the priority benefit of Japan application no. 2010-130367, filed on Jun. 7, 2010. The entirety of each of the above-mentioned patent applications is hereby incorporated by reference herein and made a part of this specification.

BACKGROUND OF THE INVENTION

Field of the Invention

The invention relates to a method for producing a product having an uneven microstructure on a surface thereof.

Description of Related Art

In recent years, it is known that the products with the uneven microstructure on a surface thereof present antireflection effects, lotus effects and the like, whereas the period of the uneven microstructure is equal to or less than the wavelength of visible light. Particularly, because refractive indices keep increasing continuously from the refractive index of the air to the refractive index of the product, the uneven structure that is constructed with slightly convex cone structures, so-called the moth-eye-structure, becomes an effective antireflection means.

The method of forming the uneven microstructure on the surface of the product arouses interest, which is performed by inserting a liquid active energy ray curable resin composition between a substrate and a mold having a surface with the uneven microstructure thereon, and irradiating with an active energy ray for curing the active energy ray curable resin composition to form a cured resin layer, onto which the uneven microstructure is transferred, on the surface of the substrate.

Furthermore, a mold, which has anodized aluminum with multiple pores on a surface of an aluminum substrate and is used as the aforementioned mold, is of interest because the mold can be easily manufactured (Patent literature No. 1).

However, based on the following reasons (i)-(iii), a contact interface between the active energy ray curable resin composition and the aforementioned mold is significantly increased, and consequently it is difficult to release the mold from the cured resin layer.

(i) The average interval between the pores of the anodized aluminum is about 100 nm, and the distance between the closest portions of the adjacent pores ranges from several nanometers to tens nanometers. That is, the structure is very fine.

(ii) As described in Patent literature No. 1, when etching and anodizing are repeatedly performed to form the pores, the smoothness of walls of the pores decreases and the walls of the pores may be roughened to some extent.

(iii) If attempted to obtain functions such as sufficient antireflection effect, the aspect ratio of the pores needs to be relatively enlarged.

As a method for improving the releasability of the cured resin layer and the mold, a method is proposed to treat the surface of the mold, on which the uneven microstructure is formed, with a release agent (external release agent) having a functional group (B) capable of reacting with a functional group (A) existing on the surface (Patent literature No. 2).

However, the above-mentioned method has the following problems (iv) and (v).

(iv) If the uneven microstructure of the mold is transferred repeatedly, the external release agent is peeled off from the surface of the mold, and the releasability between the cured resin layer and the mold is lowered gradually. As the releasability between the cured resin layer and the mold decreases, the productivity of the product also declines. Moreover, a portion of the transferred uneven microstructure is damaged, and the transfer accuracy of the uneven microstructure is reduced.

(v) The external release agent peeled off from the surface of the mold is transited to the surface of the product and contaminates the surface of the product. The contamination may last for a period of time starting from the beginning of the transfer (until repetitively transferring for several hundred times, for example). Therefore, products, which are obtained during the period from the beginning of the transfer until the products have less surface contamination and have stabilized surface property, cannot be sold. The raw materials or ingredients that are consumed before the surface property of the products becomes stabilized are wasted.

REFERENCES LIST

Patent Literature

Patent literature No. 1: Japan Patent Publication No. 2005-156695.
Patent literature No. 2: Japan Patent Publication No. 2007-326367.

SUMMARY OF THE INVENTION

Problems that the Invention is to Solve

The invention provides a method for producing a product having an uneven microstructure on a surface thereof, which maintains the releasability of a cured resin layer and a mold in repeatedly transferring an uneven microstructure of the mold and greatly reduces a contamination of the surface of the product caused by transition of an external release agent by comparatively fewer times of transfer.

Means for Solving the Problems

The method for producing the product having the uneven microstructure on the surface thereof, as disclosed in this invention, is characterized in including the following steps (I)-(II).

(I) the step of treating the surface of the mold having the uneven microstructure thereon with an external release agent containing fluorine and not containing a functional group (B) which is capable of reacting with a functional group (A) existing on the surface.

(II) after Step (I), the step of inserting an active energy ray curable resin composition containing an internal release agent between a substrate and the mold and irradiating with an active energy ray for curing the active energy ray curable resin composition to form a cured resin layer, onto which the uneven microstructure is transferred, on the surface of the substrate and obtain the product having the uneven microstructure on the surface thereof.

The internal release agent is preferably a poly(oxyethylene) alkyl phosphate compound.

The external release agent is preferably a compound having a perfluoropolyether structure.

The uneven microstructure on the surface of the mold is preferably formed of anodized aluminum.

Effect of the Invention

According to the producing method of the product having the uneven microstructure on the surface thereof, as disclosed in the invention, the releasability of the cured resin layer and the mold is maintained in repeatedly transferring the uneven microstructure of the mold, and the contamination of the surface of the product caused by transition of the external release agent is greatly reduced by comparatively fewer times of transfer of the uneven microstructure. Thus, the product having the uneven microstructure thereon is produced with good productivity.

DESCRIPTION OF THE EMBODIMENTS

According to the preferred embodiment of the present invention, the uneven microstructure refers to a structure having convex or concave with an average interval (period) equal to or less than the visible light wavelength, i.e. equal to or less than 400 nm. Also, the active energy ray represents visible light, ultraviolet light, electron beam, plasma, or heat ray (infrared ray etc.) and the like. (Poly)oxyethylene alkyl phosphate compounds represent oxyethylene alkyl phosphate compound having one oxyethylene group or poly(oxyethylene) alkyl phosphate compound having two or more than two oxyethylene groups. In addition, (meth)acrylate represents acrylate or methacrylate.

<Producing Method of the Product>

A method for producing a product having an uneven microstructure on a surface thereof, as disclosed in this invention, includes the following steps (I)-(II).

(I) the step of treating a surface of a mold having an uneven microstructure thereon with an external release agent containing fluorine and not containing a functional group (B) which is capable of reacting with a functional group (A) existing on the surface.

(II) after Step (I), the step of inserting an active energy ray curable resin composition containing an internal release agent between a substrate and the mold, and irradiating with an active energy ray for curing the active energy ray curable resin composition to form a cured resin layer, onto which the uneven microstructure is transferred, on a surface of the substrate and obtain the product having the uneven microstructure on the surface thereof.

[Step (I)]
(Mold)

The following mold (α) or (β) is used as the mold. From the point of view of fabricating a mold with a large area or fabricating a roll mold easily, the mold (β) is preferred.

The mold (α) is a mold with the uneven microstructure formed on the surface of a mold substrate by electron beam lithography method, laser interference method, photolithography, etc.

The mold (β) is a mold with anodized aluminum having multiple pores (the uneven microstructure) formed on the surface of an aluminum substrate.

The mold (β) can be produced by a method having the following steps (a)-(f).

Step (a) anodizing the aluminum substrate under a constant voltage in an electrolytic solution to form an oxide film on the surface of the aluminum substrate.

Step (b) removing the oxide film to form the pore generation spots of the anodic oxidation on the surface of the aluminum substrate.

Step (c) anodizing the aluminum substrate in the electrolytic solution again to form an oxide film having pores at the pore generation spots.

Step (d) expanding the diameter of the pore.

Step (e), after step (d), anodizing in the electrolytic solution again.

Step (f) repeating steps (d) and (e), to obtain a mold with the anodized aluminum (alumina) having a plurality of pores formed on the aluminum surface.

Step (a)

Figure 1:
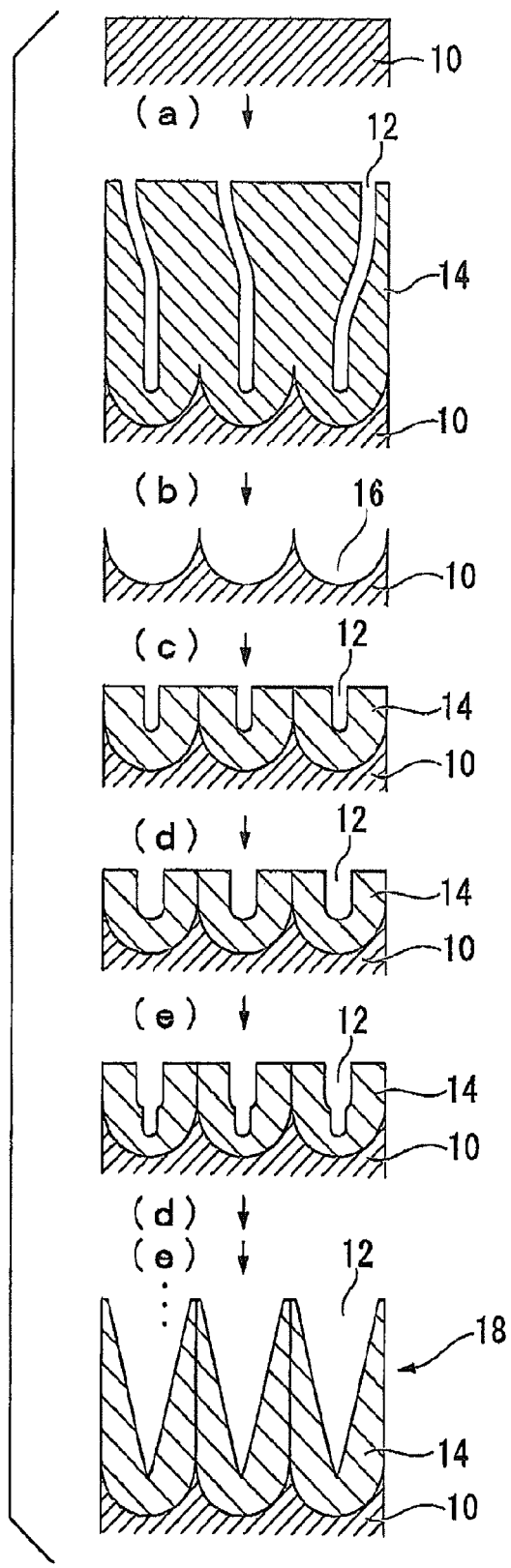
FIG. 1 is a schematic cross-sectional view showing a manufacturing process of a mold having anodized aluminum on a surface thereof.

As shown in FIG. 1, the aluminum oxide film 14 having pores 12 is formed when the aluminum substrate 10 is anodized.

The shape of the aluminum substrate may be exemplified as a roll, a cylindrical tube, a flat plate, a sheet and the like.

Further, in order to smooth the surface state of the aluminum substrate, the aluminum substrate is preferably polished by mechanical polishing, buffing, chemical polishing, electrolytic polishing (such as etching process), or the like. In addition, since oil used in processing the aluminum substrate into a predetermined shape may be attached to the aluminum substrate, it is preferred that the aluminum substrate is pre-degreased before anodic oxidation.

The purity of the aluminum is preferably 99% or more, more preferably 99.5% or more, and particularly preferably 99.8% or more. If the purity of the aluminum is low, when anodizing the aluminum, an uneven structure that is large enough to scatter visible light may be formed due to segregation of impurities, and the regularity of the pores obtained by anodic oxidation may be reduced.

For the electrolytic solution, sulfuric acid, oxalic acid, phosphoric acid and the like may be used.

When oxalic acid is used as the electrolytic solution, the concentration of oxalic acid is preferably equal to or less than 0.7M. When the concentration of oxalic acid is more than 0.7M, the current value is too high, which results in rough surface of the oxide film.

When the formation voltage is 30-60V, the anodized aluminum having a high pore regularity with an average interval of 100 nm is obtained. If the formation voltage is higher or lower than this range, the pore regularity is likely to decline.

The temperature of the electrolytic solution is preferably equal to or less than 60° C., and more preferably equal to or less than 45° C. When the temperature of the electrolytic solution exceeds 60° C., a phenomenon called "burning" may occur, the pores may be damaged, and the regularity of the pores may be disturbed as the surface is melted.

In the case of using sulfuric acid as the electrolytic solution, the concentration of sulfuric acid is preferably equal to or less than 0.7M. When the concentration of sulfuric acid is exceeds 0.7M, the current value becomes too high and it is impossible to maintain a constant voltage.

When the formation voltage is 25-30V, the anodized aluminum having a high pore regularity with an average interval of 63 nm is obtained. If the formation voltage is higher or lower than this range, the pore regularity is likely to decline.

The temperature of the electrolytic solution is preferably equal to or less than 30° C., and more preferably equal to or less than 20° C. When the temperature of the electrolytic solution exceeds 30° C., the phenomenon called "burning" may occur, the pores may be damaged, and the regularity of the pores may be disturbed as the surface is melted.

Step (b)

As shown in FIG. 1, once the oxide film 14 is removed and pore generation spots 16 of the anodic oxidation are obtained. By doing so, the regularity of the pores is improved.

The method for removing the oxide film may be exemplified by a method of dissolving and removing the oxide film in a solution that is capable of selectively dissolving the oxide film but not dissolving aluminum. Examples of such a solution include a mixture solution of chromic acid/phosphoric acid and the like.

Step (c)

As shown in FIG. 1, the aluminum substrate 10, from which the oxide film is removed, is again anodized so as to form the oxide film 14 having cylindrical pores 12.

The anodic oxidation may be carried out under the same conditions as recited in the step (a). Deeper pores can be formed by performing the anodic oxidation for a longer period of time.

Step (d)

As shown in FIG. 1, a process for expanding the diameter of the pores 12 (hereinafter, referred to as pore expanding process) is performed. The pore expanding process is a process to expand the diameter of the pores, which is obtained by performing anodic oxidation, by immersing the pores in the solution that dissolves the oxide film. Examples of the solution include the aqueous solution of phosphoric acid of about 5 mass %, and the like.

The diameter of the pores can be enlarged if the pore expanding process is performed for a longer period of time.

Step (e)

As shown in FIG. 1, the anodic oxidation is performed again to extend the cylindrical pores 12 downward from bottoms thereof and further to form the cylindrical pores 12 with a small diameter.

The anodic oxidation may be carried out under the same conditions as recited in the step (a). Deeper pores can be formed by performing the anodic oxidation for a longer period of time.

Step (f)

As shown in FIG. 1, the pore expanding process of Step (d) and the anodic oxidation of Step (e) are repetitively performed to form the oxide film 14 having the pores 12 (each of the pores 12 has an opening with a diameter continuously diminishing from the opening in a depth direction). Hence, the mold 18 with the aluminum substrate 10 having the anodized aluminum (porous aluminum oxide film, alumite) formed on a surface thereof is obtained. Preferably, the whole process is finished with the Step (d).

The pore expanding process and the anodic oxidation are performed preferably for three times or more in total, more preferably 5 times or more. If the foregoing processes are performed for two times or less, the diameter of the pores is not continuously reduced, and the reflectivity reduction effect of the moth-eye structure which is formed by using the anodized aluminum having such pores may be insufficient.

The shape of the pores 12 may be exemplified as a cone shape, a pyramid shape, a column shape, etc. The cone shape and the pyramid shape, etc., of which the pore cross-sectional area that is perpendicular to the depth direction continuously decreases from the top in the depth direction, are preferred.

The average interval of the pores 12 is equal to or less than the wavelength of visible light, that is, 400 nm. The average interval of the pores 12 is preferably equal to or more than 20 nm.

The average interval of the pores 12 is observed by using the electronic microscope to measure 10 intervals between the adjacent pores 12 (distance from the center of one pore 12 to the center of the adjacent pore 12) and determining the average value by averaging the values of the 10 intervals.

The aspect ratio of the pores 12 (the pore depth/the average interval between the pores) is preferably 0.8 to 5.0, more preferably 1.2 to 4.0, and particularly preferably 1.5 to 3.0.

The depth of the pores 12 is obtained by measuring the distance between the bottom of the pores 12 and the top part of the convex portion existing between the pores 12 when observed at a magnification of 30,000 times by the electronic microscope.

(External Release Agent)

Step (I) is to treat the surface of the mold having the uneven microstructure formed thereon with the external release agent containing fluorine but not containing the functional group (B) capable of reacting with the functional group (A) existing on the surface of the mold.

The functional group (A) represents a functional group that is capable of reacting with the functional group (B) to form a chemical bond.

The functional group (A) may be exemplified as a hydroxyl group, an amino group, a carboxyl group, a mercapto group, an epoxy group, an ester group, etc. When the uneven microstructure on the surface of the mold is anodized aluminum, the functional group (A) is a hydroxyl group.

The functional group (B) represents a functional group that is capable of reacting with the functional group (A) to form a chemical bond or a functional group that is easily converted to the above functional group.

In the case of the functional group (A) being hydroxyl, the functional group (B) may be a hydrolyzable silyl group, silanol groups, a hydrolyzable group containing a titanium atom or an aluminum atom, etc. The hydrolyzable silyl group is a group that produces a silanol (Si—OH) group by hydrolysis, and the hydrolyzable silyl group may be Si—OR (R is an alkyl group), Si—X (X is a halogen atom) and the like.

When considering the adhesion to the surface of the mold, the common knowledge so far is to use the external release agent having the functional group (B) capable of reacting with the functional group (A) existing on the surface of the mold (preferably a fluoro-compound having a hydrolyzable silyl group and more preferably a compound having a fluoroalkyl or a perfluoropolyether structure). The commercially available fluoro-compound having a hydrolyzable silyl group may be exemplified as fluoroalkyl silane, KBM-7803 (Manufactured by Shin-Etsu Chemical Co., Ltd.), MRAF (manufactured by Asahi Glass Company, Limited), OPTOOL series (manufactured by Daikin Industries, Ltd.), Novec EGC-1720 (manufactured by Sumitomo 3M), FS-2050 series (manufactured by Fluoro Technology), and the like.

However, the fluoro-compound having a hydrolyzable silyl group causes certain problems: uneven coating resulting from aggregation on the surface of the mold caused by self-condensation of the silanol groups, self-condensation occurring in the solution, and shortened lifetime of the release agent solution.

On the other hand, in the invention, an external release agent that does not contain the functional group (B) capable of reacting with the functional group (A) existing on the surface of the mold is used.

When the functional group (A) is hydroxyl, the external release agent that does not contain the functional group (B) capable of reacting with the functional group (A) is, for example, an external release agent where the functional group (B) is replaced with hydroxyl, ester, alkyl, ether and the like.

The above-mentioned problems hardly occur on the external release agent that does not contain the functional group (B) capable of reacting with the functional group (A). Furthermore, since the functional group (B) does not form a chemical bond with the functional group (A) existing on the surface of the mold, the external release agent can be removed relatively easily from the surface of the mold. Therefore, with relatively fewer times of the transfer, the contamination of the surface of the product due to the transition of the external release agent is sufficiently reduced.

When the functional group (A) is hydroxyl, the external release agent that does not contain the functional group (B) capable of reacting with the functional group (A) is preferably a compound having a perfluoropolyether structure, from the viewpoint of relatively good releasability. Examples of commercially available products of the compound having a perfluoropolyether structure may be FLUOROLINK series, FOMBLIN series (manufactured by Solvay Solexis Co., Ltd.) and the like.

The treating method using the external release agent may be exemplified as the following methods (I-1) and (I-2). For treating the surface of the mold at the side formed with the uneven microstructure with the external release agent without unevenness, the method (I-1) is particularly preferred.

Method (I-1) is a method of immersing the mold in a dilute solution of the external release agent.

Method (I-2) is a method of applying the external release agent or the dilute solution thereof to the surface of the mold with the uneven microstructure formed thereon.

Method (I-1) is preferably a method having the following steps (g)-(k).

Step (g): washing the mold with water.

Step (h): after Step (g), removing the water droplets attached to the surface of the mold by blowing air into the mold.

Step (i): immersing the mold into the dilute solution that is obtained by diluting the fluoro-compound with a solvent.

Step (j): withdrawing the immersed mold from the solution slowly.

Step (k): drying the mold.

Step (g)

The agents (such as the aqueous solution of phosphoric acid used in the pore expanding process) used for forming the uneven microstructure and impurities (such as dust etc.) attached to the mold are removed by water washing.

Step (h)

Air is blown into the mold, so as to remove almost all water droplets visible to the naked eye.

Step (i)

As the solvent for dilution, any known solvent, such as fluorine-based solvents, alcohol-based solvents, etc., may be used. From the viewpoint of having the moderate volatility and wettability to apply the solution of the external release agent uniformly, the solvent for dilution is preferably a fluorine-based solvent. The fluorine-based solvent may be exemplified as hydrofluoropolyether, perfluorohexane, perfluoro methyl cyclohexane, perfluoro-1,3-dimethyl cyclohexane, dichloropentafluoropropane and the like.

In the dilute solution (100 mass %), the concentration of the external release agent ranges preferably from 0.01 mass % to 0.5 mass %.

The immersion time is preferably 1-30 minutes.
The immersion temperature is preferably 0-50° C.

Step (j)

When withdrawing the immersed mold from the solution, it is preferred to use an electric pulling device to withdraw at a constant speed to reduce swing during withdrawing. By doing so, the uneven coating can be reduced.

The withdrawing speed is preferably 1 mm/sec-10 mm/sec.

Step (k)

In the step of drying the mold, the mold may be air dried or compulsorily dried by heating the mold in the dryer.

The drying temperature is preferably 30-150° C.
The drying time is preferably 5-300 minutes.

Whether the surface of the mold has been treated with the external release agent can be confirmed by measuring the water contact angle of the surface of the mold. The water contact angle of the surface of the mold that has been treated with the external release agent is preferably equal to or larger than 60°, more preferably equal to or larger than 90°. If the water contact angle is equal to or larger than 60°, the surface of the mold is well treated with the external release agent, and the releasability between the cured resin layer and the mold is good.

By treating the surface of the mold having the uneven microstructure formed thereon with the external release agent, the suitable releasability is achieved at the early stage of repeatedly transferring uneven microstructure of the mold to the surface of the product. Furthermore, even under repetitive transfer, the contamination of the surface of the product due to the transition of the external release agent is greatly reduced at relatively fewer times of transfer. Hence, the product having the uneven microstructure on the surface thereof can be produced with high productivity.

If the releasability is not good, that is, the peeling force exceeds the adhesion between the substrate and the cured resin layer and a larger force is required to release the mold, the cured resin remains in the concave structure of the mold. Further, since an excessive stress is applied to the substrate and the cured resin layer, the undesirable breaking of the cured resin layer portion, deformation (elongation) or cracking of the substrate is likely to occur. In addition, it is difficult to release the cured resin within the concave structure of the mold out of the mold, and the pattern accuracy is deteriorated. In nanoimprint, it is preferable to maintain a small release force even after repeatedly transferring.

[Step (II)]

In Step (II), the active energy ray curable resin composition containing the internal release agent is inserted between the substrate and the mold and is cured by irradiation with the active energy ray to form the cured resin layer, onto which the uneven microstructure is transferred, on the surface of the substrate and obtain a product having the uneven microstructure on the surface thereof.

(Substrate)

The shape of the substrate may be exemplified as a film, a sheet, injection molded products and press molded products and the like.

Examples of the material of the substrate may include polycarbonate, polystyrene resin, polyester, acrylic resin, cellulose resin (triacetyl cellulose, etc.), polyolefins, glass and the like.

(Active Energy Ray Curable Resin Composition)

The active energy ray curable resin composition is a composition including a polymerizable compound, a polymerization initiator and an internal release agent.

The viscosity of the composition at 25° C. is preferably 10000 mPa·s or less, more preferably 5000 mPa·s or less, particularly preferably 2000 mPa·s or less. If the viscosity of the composition at 25° C. is 10000 mPa·s or less, traceability of the composition to the uneven microstructure is good, so that the uneven microstructure can be accurately transferred. Using the E-type rotary viscometer, the viscosity of the composition is measured at 25° C.

(Internal Release Agent)

The internal release agent is a substance that is blended within the active energy ray curable resin composition to enhance the releasability of the cured article (the cured resin layer) of the active energy ray curable resin composition from the mold.

The internal release agent may be fluorine-containing compounds, silicone compounds, phosphate ester compounds, compounds having a long-chain alkyl group, solid wax (polyethylene wax, amide wax, polytetrafluoroethylene powders), and the like.

(Poly)oxyethylene alkyl phosphate compounds are preferably used as the internal release agent in terms of achieving the suitable releasability between the mold and the cured resin layer. With the suitable releasability, the release load between the cured article of the active energy ray curable resin composition and the mold is lowered, the damage to the uneven structure is decreased thus the uneven microstructure of the mold is efficiently and accurately transferred.

From the viewpoint of the releasability, (poly)oxyethylene alkyl phosphate compounds represented by the following formula (1) are preferred.

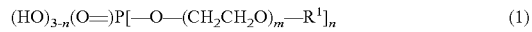

$$(HO)_{3-n}(O=)P[-O-(CH_2CH_2O)_m-R^1]_n \qquad (1)$$

$R^1$ is an alkyl group, m is an integer of 1-20, n is an integer of 1-3.

$R^1$ is preferably an alkyl group having 1-20 carbon atoms, more preferably an alkyl group having 3-18 carbon atoms.

m is preferably an integer of 1-10.

(Poly)oxyethylene alkyl phosphate compounds may be monoesters (n=1), diesters (n=2), or triesters (n=3). In the case of being the diester or triester, the plurality of (poly) oxyethylene alkyl groups in one molecule may be different.

Examples of commercial products of the (poly)oxyethylene alkyl phosphate compounds may be exemplified as the following.

manufactured by Johoku Chemical Co.: JP-506H,
manufactured by Axel Co.: Mold Uiz INT-1856,
manufactured by Nikko Chemicals Co.: TDP-10, TDP-8, TDP-6, TDP-2, DDP-10, DDP-8, DDP-6, DDP-4, DDP-2, TLP-4, TCP-5, DLP-10.

The (poly)oxyethylene alkyl phosphate compounds may be used as a single kind or a combination of two or more kinds.

Relative to 100 parts by mass of the polymerizable compound, the amount of (poly)oxyethylene alkyl phosphate compounds is preferably 0.01 to 1 part by mass, more preferably 0.05 to 0.5 parts by mass, even more preferably 0.05 to 0.1 parts by mass. When the amount of (poly) oxyethylene alkyl phosphate compounds is 1 part by mass or less, it can be suppressed that the characteristics of the cured resin layer is deteriorated and the adhesion between cured resin layer and the substrate is weakened. As a result, peeling of the cured resin layer from the product or the resin residue on the mold (poor mold release) is suppressed. When the amount of (poly)oxyethylene alkyl phosphate compounds is 0.01 parts by mass or more, the releasability from the mold becomes sufficient and the resin residue on the mold (poor mold release) is suppressed.

(Polymerizable Compounds)

Polymerizable compounds may be exemplified as monomers, oligomers or reactive polymers having free radical polymerization bond(s) and/or cationic polymerization bond(s), etc. in molecule.

Examples of the monomer having a free radical polymerization bond may be a monofunctional monomer, a polyfunctional monomer and the like.

The monofunctional monomer includes alkyl (meth)acrylates such as methyl (meth)acrylate, ethyl (meth)acrylate, propyl (meth)acrylate, n-butyl (meth)acrylate, i-butyl (meth) acrylate, s-butyl (meth)acrylate, t-butyl (meth)acrylate, 2-ethylhexyl (meth)acrylate, lauryl (meth)acrylate, tridecyl (meth)acrylate, stearyl (meth)acrylate and the like; (meth) acrylate derivatives such as cyclohexyl (meth)acrylate, benzyl (meth)acrylate, phenoxyethyl (meth)acrylate, isobornyl (meth)acrylate, glycidyl (meth)acrylate, tetrahydrofurfuryl (meth)acrylate, allyl (meth)acrylate, 2-hydroxyethyl (meth) acrylate, hydroxypropyl (meth)acrylate, 2-methoxyethyl (meth)acrylate, 2-ethoxyethyl (meth)acrylate and the like; (meth)acrylic acid, (meth)acrylonitrile; styrene derivatives such as styrene, α-methyl styrene; (meth)acrylamide derivatives such as (meth)acrylamide, N,N-dimethyl (meth)acrylamide, N,N-diethyl (meth)acrylamide, dimethylaminopropyl (meth)acrylamide and the like. The foregoing compounds may be used in a combination of two or more kinds or may be used singly.

The polyfunctional monomers include bifunctional monomers such as ethylene glycol di(meth)acrylate, tripropylene glycol di(meth)acrylate, isocyanuric acid ethylene oxide modified di(meth)acrylate, triethylene glycol di(meth)acrylate, diethylene glycol di(meth)acrylate, neopentyl glycol di(meth)acrylate, 1,6-hexanediol di(meth)acrylate, 1,5-pentanediol di(meth)acrylate, 1,3-butylene glycol di(meth)acrylate, polybutylene glycol di(meth)acrylate, 2,2-bis(4-(meth)acryloxypolyethoxyphenyl) propane, 2,2-bis(4-(meth)acryloxyethoxyphenyl) propane, 2,2-bis(4-(3-(meth)acryloxy-2-hydroxypropoxy)phenyl) propane, 1,2-bis(3-(meth)acryloxy-2-hydroxypropoxy) ethane, 1,4-bis(3-(meth)acryloxy-2-hydroxypropoxy) butane, dimethylol tricyclodecane di(meth)acrylate, bisphenol A ethylene oxide adduct di(meth)acrylate, bisphenol A propylene oxide adduct di(meth)acrylate, hydroxypivalic acid neopentyl glycol di(meth)acrylate, divinylbenzene, methylenebisacrylamide and the like; tri-functional monomers such as pentaerythritol tri(meth)acrylate, trimethylolpropane tri(meth)acrylate, trimethylolpropane ethylene oxide modified tri(meth)acrylate, trimethylolpropane propylene oxide modified triacrylate, trimethylolpropane ethylene oxide modified triacrylate, isocyanuric acid ethylene oxide modified tri(meth)acrylate and the like; tetra-functional monomers such as condensation reaction mixture of succinic acid/trimethylolethane/acrylic acid, dipentaerythritol hexa(meth)acrylate, di pentaerythritol penta(meth)acrylate, ditrimethylolpropane tetraacrylate, tetramethylolmethane tetra(meth)acrylate and the like; urethane acrylate of two or more functional groups, polyester acrylate of two or more functional groups, and the like. The foregoing compounds may be used in a combination of two or more kinds or may be used singly.

Examples of the monomers having a cationic polymerization bond may be the monomers having an epoxy group, an oxetanyl group, an oxazolyl group, a vinyloxy group and the like. The monomer having an epoxy group is particularly preferable.

Oligomers or reactive polymers may be exemplified as unsaturated polyesters such as condensation products of polyhydric alcohol and unsaturated dicarboxylic acid; polyester (meth)acrylates, polyether (meth)acrylate, polyol (meth)acrylate, epoxy (meth)acrylate, urethane (meth)acrylates, cationic polymerizable epoxy compounds, homopolymers or copolymers of the above-described monomers having a free radical polymerization bond at the side chains, and the like.

(Polymerization Initiator)

When using the photocuring reaction, examples of the photo-polymerization initiators include carbonyl compounds, such as benzoin, benzoin methyl ether, benzoin ethyl ether, benzoin isopropyl ether, benzoin isobutyl ether, benzil, benzophenone, p-methoxy-benzophenone, 2,2-diethoxyacetophenone, α,α-dimethoxy-α-phenyl acetophenone, methylphenyl glyoxylate, ethylphenyl glyoxylate, 4,4'-bis(dimethylamino) benzophenone, 2-hydroxy-2-methyl-1-phenylpropan-1-one and the like; sulfur compounds such as tetramethyl thiuram monosulfide, tetramethyl thiuram disulfide and the like; 2,4,6-trimethyl benzoyl diphenyl phosphine oxide, benzoyl diethoxy phosphine oxide and the like. The foregoing compounds may be used in a combination of two or more kinds or may be used singly.

When using electron beam curing reaction, examples of the polymerization initiators include thioxanthone such as benzophenone, 4,4-bis(diethylamino) benzophenone, 2,4,6-trimethyl benzophenone, methyl o-benzoyl benzoate, 4-phenyl-benzophenone, t-butyl anthraquinone, 2-ethyl anthraquinone, 2,4-diethyl thioxanthone, isopropylthioxanthone, 2,4-dichloro thioxanthone and the like; acetophenone such as diethoxyacetophenone, 2-hydroxy-2-methyl-1-phenylpropan-1-one, benzyl dimethyl ketal, 1-hydroxycyclohexylphenyl ketone, 2-methyl-2-morpholino-(4-thiomethylphenyl) propan-1-one, 2-benzyl-2-dimethylamino-1-(4-morpholinophenyl)-butanone and the like; benzoin ethers such as, benzoin methyl ether, benzoin ethyl ether, benzoin isopropyl ether, benzoin isobutyl ether, etc.; acyl phosphine oxides such as, 2,4,6-trimethyl benzoyl diphenyl phosphine oxide, bis (2,6-dimethoxyphenyl)-2,4,4-trimethyl pentyl phosphine oxide, bis(2,4,6-tri-methyl-benzoyl) phenyl phosphine oxide and the like; methyl benzoyl formate, 1,7-bis acridinyl heptane, 9-phenyl acridine and the like. The foregoing compounds may be used in a combination of two or more kinds or may be used singly.

When using a thermal curing reaction, examples of a thermal polymerization initiator include the organic peroxides such as methyl ethyl ketone peroxide, benzoyl peroxide, dicumyl peroxide, t-butyl hydroperoxide, cumene hydroperoxide, t-butyl peroxy octoate, t-butyl peroxybenzoate, lauroyl peroxide and the like; azo compounds such as azobisisobutyronitrile and the like; a redox polymerization initiator such as a combination of amine such as N,N-dimethyl aniline, N,N-dimethyl p-toluidine, etc. with the above organic peroxides.

Relative to 100 parts by mass of the polymerizable compound, the amount of the polymerization initiator is preferably 0.1 to 10 parts by mass. When the amount of the polymerization initiator is less than 0.1 part by mass, the polymerization is tend to be difficult to proceed. If the amount of the polymerization initiator exceeds 10 parts by mass, the cured film may be colored or the mechanical strength is lowered.

(Other Components)

The active energy ray curable resin composition, if necessary, may optionally include additives like non-reactive polymers, the active energy ray sol-gel reaction composition, an antistatic agent, a stain-proof agent such as fluorocompounds, particles and small amounts of solvents.

The non-reactive polymer may be exemplified as acrylic resins, styrene resins, polyurethane, cellulose resins, polyvinyl butyral, polyesters, thermoplastic elastomers and the like.

The active energy ray sol-gel reaction composition may be exemplified as alkoxysilane compounds, alkyl silicate compounds and the like.

The alkoxysilane compound may be exemplified as tetramethoxysilane, tetra-i-propoxysilane, tetra-n-propoxysilane, tetra-n-butoxysilane, tetra-sec-butoxysilane, tetra-t-butoxysilane, methyltriethoxysilane, methyl tripropoxy silane, methyl tributoxy silane, dimethyl dimethoxy silane, dimethyl diethoxy silane, trimethyl ethoxy silane, trimethyl methoxy silane, trimethyl propoxy silane, trimethyl butoxy silane and the like.

The alkyl silicate compounds include methyl silicate, ethyl silicate, isopropyl silicate, n-propyl silicate, n-butyl silicate, n-pentyl silicate, acetyl silicate and the like.

(Hydrophobic Materials)

In order to maintain the water contact angle of the surface of the uneven microstructure of the cured resin layer at 90° or more, it is preferred to use a composition including the fluorine-containing compound or the silicone compounds as the active energy ray curable resin composition capable of forming the hydrophobic material.

Fluorine-Containing Compounds:

The fluorine-containing compounds may be fluorine-containing monomers, fluorine-containing silane coupling agents, fluorine-containing surfactants, fluorine-containing polymers and the like.

The fluorine-containing monomer may be fluoroalkyl-substituted vinyl monomers, fluoroalkyl-substituted ring-opening polymerizable monomers and the like.

Fluoroalkyl-substituted vinyl monomers may be fluoroalkyl-substituted (meth)acrylates, fluoroalkyl-substituted (meth)acrylamides, fluoroalkyl-substituted vinyl ethers, fluoroalkyl-substituted styrenes and the like.

Fluoroalkyl-substituted ring-opening polymerizable monomers may be fluoroalkyl-substituted epoxy compounds, fluoroalkyl-substituted oxetane compounds, fluoroalkyl-substituted oxazoline compounds, and the like.

The fluorine-containing silane coupling agents may be 3,3,3-trifluoropropyl trimethoxysilane, 3,3,3-trifluoropropyl triacetoxy silane, dimethyl-3,3,3-trifluoropropyl methoxysilane, tridecafluoro-1,1,2,2-tetrahydrooctyl triethoxysilane, and the like.

The fluorine-containing surfactants may be an anionic surfactant containing a fluoroalkyl group, an cationic surfactant containing a fluoroalkyl group, and the like.

The fluorine-containing polymers may be exemplified as polymers of fluoroalkyl group-containing monomers, copolymers of fluoroalkyl group-containing monomers and poly (oxyalkylene) group-containing monomers, copolymers of fluoroalkyl group-containing monomers and crosslinking reactive group-containing monomers, and the like. The fluorine-containing polymers may be a copolymer with other copolymerizable monomers.

Silicone Compounds:

The silicone compounds may be (meth)acrylic-modified silicone, silicone resins, silicone-based silane coupling agents and the like.

(Meth)acrylic-modified silicone may be exemplified as silicone (di) (meth)acrylate and the like. For example, it is preferred to use silicone diacrylate "x-22-164", "x-22-1602" manufactured by Shin-Etsu Chemical Co., Ltd.

(Hydrophilic Material)

In order to maintain the water contact angle of the surface of the uneven microstructure of the cured resin layer at 25° or less, it is preferred to use a composition at least including the hydrophilic monomers as the active energy ray curable resin composition capable of forming the hydrophilic material. In view of the scratch resistance or the water resistance of the cured resin layer, the composition including the crosslinking reactive polyfunctional monomers is preferred. In addition, the hydrophilic monomer may be the same as the crosslinking reactive polyfunctional monomers (i.e. hydrophilic polyfunctional monomers). In addition, the active energy ray curable resin composition may include other monomers.

The active energy ray curable resin composition capable of forming the hydrophilic material preferably uses a composition including, polyfunctional (meth)acrylate having 4 or more functional groups, hydrophilic (meth)acrylate having 2 or more functional groups, and monofunctional monomers if needed.

Polyfunctional (meth)acrylate having 4 or more functional groups may be exemplified as ditrimethylolpropane tetra(meth)acrylate, pentaerythritol tetra(meth)acrylate, pentaerythritol ethoxy tetra(meth)acrylate, dipentaerythritol hydroxy penta(meth)acrylate, dipentaerythritol hexa(meth) acrylate, condensation reaction mixtures of succinic acid/trimethylolethane/acrylic acid, in the molar ratio of 1:2:4, urethane acrylates (manufactured by DAICEL-CYTEC Co.: EBECRYL220, EBECRYL1290, EBECRYL1290K, EBECRYL5129, EBECRYL8210, EBECRYL8301, KRM8200), polyether acrylates (manufactured by DAICEL-CYTEC Ltd Co.: EBECRYL81), modified epoxy acrylates, (manufactured by DAICEL-CYTEC Co.: EBECRYL3416), polyester acrylates (manufactured by DAICEL-CYTEC Co.: EBECRYL450, EBECRYL657, EBECRYL800, EBECRYL810, EBECRYL811, EBECRYL812, EBECRYL1830, EBECRYL845, EBECRYL846, EBECRYL1870), and the like. The foregoing compounds may be used in a combination of two or more kinds or may be used singly.

The polyfunctional (meth)acrylate having 4 or more functional groups is more preferably polyfunctional (meth)acrylate having 5 or more functional groups.

The proportion of the polyfunctional (meth)acrylate having 4 or more functional groups is preferably 40-90 mass %, from the viewpoint of water resistance and chemical resistance, more preferably 50-90 mass %, and particularly preferably 60-80 mass %. When the proportion of the polyfunctional (meth)acrylate having 4 or more functional groups is equal to or more than 40 mass %, the curable resin composition offers a higher modulus of elasticity and the abrasion resistance of the cured resin layer is enhanced. When the proportion of the polyfunctional (meth)acrylate of more than 4 functional groups is equal to or less than 90 mass %, small crack on the surface is difficult to form, and poor appearance is difficult to occur.

The hydrophilic (meth)acrylate having 2 or more functional groups may be exemplified as polyfunctional acrylates having a long-chain polyethylene glycol such as ARONIX M-240, ARONIX M260 (manufactured by Toagosei Co., Ltd.), NK Ester AT-20E, NK ester ATM-35E (manufactured by Shin-Nakamura Chemical Co.), and polyethylene glycol di(meth)acrylate and the like. The foregoing compounds may be used in a combination of two or more kinds or may be used singly.

For the polyethylene glycol di(meth)acrylate, the sum of the average repeating units of the polyethylene glycol chain present in one molecule is preferably 6-40, more preferably 9-30, and particularly preferably 12-20. When the average number of repeating units of the polyethylene glycol chain is equal to or more than 6, the hydrophilicity of the curable resin composition is sufficient and the stain-proof properties of the cured resin layer are improved. When the average number of repeating units of the polyethylene glycol chain is equal to or less than 40, the compatibility between polyethylene glycol di(meth)acrylate and the polyfunctional (meth)acrylate having 4 or more functional groups becomes good, and it is difficult to separate the active energy ray curable resin composition.

The proportion of hydrophilic (meth)acrylate having 2 or more functional groups may be preferably 30-80 mass %, more preferably 40-70 mass %. When the proportion of hydrophilic (meth)acrylate having 2 or more functional groups is equal to or more than 30 mass %, the hydrophilicity of the curable resin composition is sufficient and the stain-proof properties of the cured resin layer are improved. When the proportion of hydrophilic (meth)acrylate having 2 or more functional groups is equal to or less than 80 mass %, the curable resin composition offers a higher modulus of elasticity and the abrasion resistance of the cured resin layer is enhanced.

Monofunctional monomer is preferably a hydrophilic monofunctional monomer.

The hydrophilic monofunctional monomers may be exemplified as monofunctional (meth)acrylates having a polyethylene glycol chain in an ester group, such as M-20G, M-90G, M-230G (manufactured by Shin-Nakamura Chemical Co.) and the like; monofunctional (meth)acrylates having a hydroxyl in an ester group such as hydroxyalkyl (meth)acrylate and the like; monofunctional acrylamides; cationic monomers such as methacrylamide propyl trimethyl ammonium methyl sulfate, methacryloyloxyethyl trimethyl ammonium methyl sulfate and the like.

Further, viscosity modifiers such as acryloyl morpholine, vinyl pyrrolidone and the like and adhesion enhancers such as the class of acryloyl isocyanate to improve the adhesion to the body of the product may be used as the monofunctional monomer.

The proportion of the monofunctional monomer is preferably 0-20 mass %, more preferably 5-15 mass %. By using the monofunctional monomer, the adhesion between the substrate and the cured resin is improved. If the proportion of the monofunctional monomer is equal to or less than 20 mass %, without insufficient polyfunctional (meth)acrylate having 4 or more functional groups or hydrophilic (meth) acrylate having 2 or more functional groups, the stain-proof property or abrasion resistance of the cured resin layer is fully presented.

One, two or more kinds of the monofunctional monomers may be (co)polymerized into a polymer of low degree of polymerization and blended in 0-35 parts by mass into the active energy ray curable resin composition. The polymer of low polymerization degree may be monofunctional (meth) acrylates having a polyethylene glycol chain in an ester group such as M-230G (manufactured by Shin-Nakamura Chemical Co.) and the like, and methacrylamide propyl trimethyl ammonium methyl sulfate 40/60 co-polymerized oligomer (manufactured by MRC Unitech, MG polymer) and the like.

(Manufacturing Apparatus)

Figure 2:
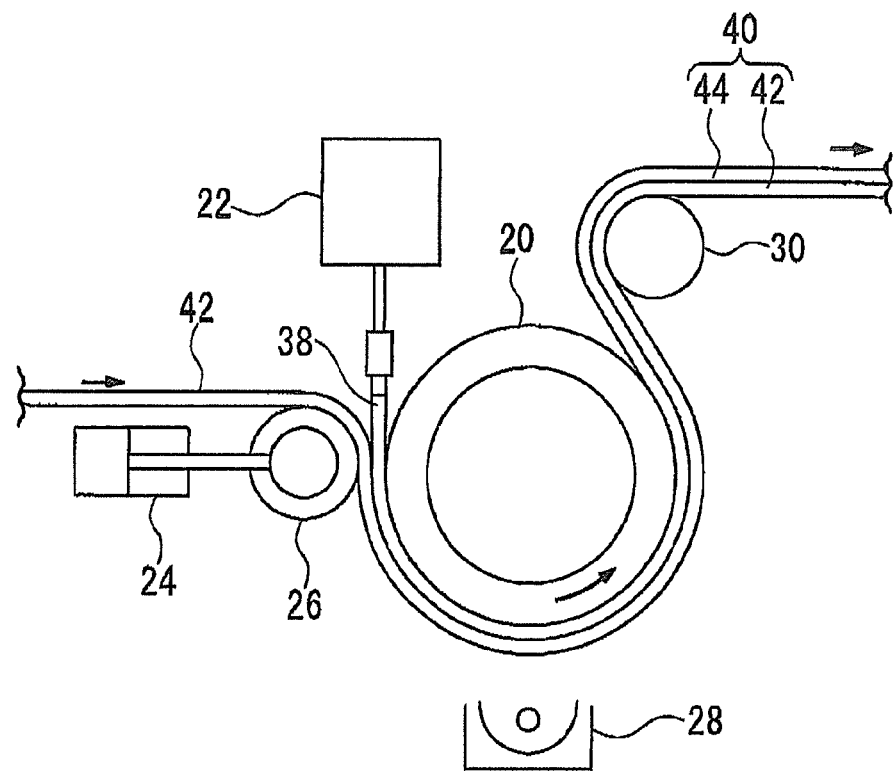
FIG. 2 is a block diagram showing an example of a manufacturing apparatus for producing a product having an uneven microstructure on the surface thereof.

The product having the uneven microstructure on the surface thereof is produced, for example, by using the manufacturing apparatus shown in FIG. 2 based on the following processes.

The active energy ray curable resin composition 38, from the tank 22, is supplied between a roll mold 20 having the uneven microstructure (not shown) formed thereon and the strip film (substrate) 42 that moves along the surface of the roll mold 20 in synchronization with the rotation of the roll mold 20.

The active energy ray curable resin composition 38 and the film 42 are nipped between the roll mold 20 and the nip rolls 26 with a nip pressure adjusted by a pneumatic cylinder 24, so that the active energy ray curable resin composition 38 is distributed uniformly between the film 42 and the roll mold 20 and at the same time filled into the concave of the uneven microstructure of the roll mold 20.

From the active energy ray irradiation device 28, which is disposed below the roll mold 20, the active energy ray is irradiated to the active energy ray curable resin composition 38 through the film 42 to cure the active energy ray curable resin composition 38, so as to form a cured resin layer 44, onto which the uneven microstructure on the surface of the roll mold 20 is transferred.

Figure 3:
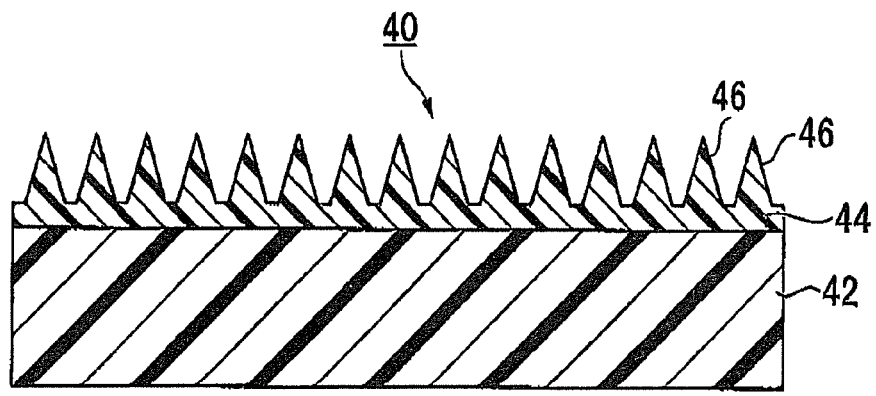
FIG. 3 is a schematic cross-sectional view showing an example of the product having the uneven microstructure on the surface thereof.

The film 42 with the cured resin layer 44 formed thereon is peeled off from the roll mold 20 by the peeling roll 30, so as to obtain a product 40 as shown in FIG. 3.

The active energy ray irradiation device 28 may preferably be a high-pressure mercury lamp, a metal halide lamp, the fusion lamp, etc., and the irradiation energy in this case is preferably 100-10000 mJ/cm$^2$.

(Products)

FIG. 3 is a schematic cross-sectional view showing an example of the product 40 having the uneven microstructure on the surface thereof.

The film 42 is a light transparent film. The material of the film 42 may be exemplified as polycarbonate, polystyrene resin, polyester resin, polyurethane, acrylic resin, polyethersulfone, polysulfones, polyether ketone, cellulose resin(triacetyl cellulose, etc.), polyolefins, alicyclic polyolefins and the like.

The cured resin layer 44 is a film made of a cured article of the active energy ray curable resin composition, and has uneven microstructure on the surface thereof.

In the case of using a mold of anodized aluminum, the uneven microstructure on the surface of the product 40, which has been formed by transferring a plurality of pores on the surface of anodized aluminum, includes a plurality of protrusions 46 constituted by the cured article of the active energy ray curable resin composition.

As the uneven microstructure, the so-called moth-eye structure with a plurality of protrusions of substantially conical or pyramid shape arranged as multi-lined is preferred. The moth-eye structure with the interval between the protrusions equal to or less than the wavelength of visible light is known to be effective means for antireflection because the refractive indices are increased continuously from the refractive index of air to the refractive index of the material.

The average interval between the protrusions is equal to or less than the wavelength of visible light, i.e. equal to or less than 400 nm. When the protrusions are formed by using the mold of anodized aluminum, as the average interval between the protrusions is about 100 to 200 nm, 250 nm or less is particularly preferred.

From the viewpoint of simple construction of the protrusions, the average interval between the protrusions is preferably equal to or more than 20 nm.

The average interval between the protrusions is obtained by measuring 10 values of the interval (the distance from the center of one protrusion to the center of the adjacent protrusion) between adjacent protrusions by the electronic microscope and then calculating the average of these values.

The aspect ratio (height of the protrusion/the average interval between the protrusions) of the protrusions is preferably 0.8 to 5.0, more preferably 1.2 to 4.0, and particularly preferably 1.5 to 3.0. When the aspect ratio is equal to or more than 0.8, the reflectivity becomes sufficiently low and the wavelength dependence of the reflectivity is small. When the aspect ratio of the protrusions is equal to or less than 5.0, the abrasion resistance of the protrusions is favorable.

The height of the protrusions is obtained by measuring the distance between the top part of the protrusions and the bottom of the concave between the protrusions when observed at a magnification of 30,000 by the electronic microscope.

Each of the protrusions has a shape that the cross-sectional area thereof in a direction perpendicular to the height direction continuously increases from the surface in the depth direction. That is, the preferred shape of the cross-section of the protrusions in the height direction may be a triangular shape, a trapezoid, a bell shape, etc.

The difference between the refractive index of the cured resin layer 44 and the refractive index of the film 42 is preferably 0.2 or less, more preferably 0.1 or less, particularly preferably 0.05 or less. When the refractive index difference is equal to or less than 0.2, the reflection at the interface between the cured resin layer 44 and the film 42 is suppressed.

In the case that the surface has the uneven microstructure thereon, super water repellency over the surface can be obtained due to the lotus effect if the surface is made of a hydrophobic material. Moreover, super hydrophilicity can be obtained over the surface if the surface is made of a hydrophilic material.

When the material of the cured resin layer 44 is the hydrophobic material, the water contact angle of the surface of the uneven microstructure is preferably equal to or larger than 90°, more preferably equal to or larger than 110°, and particularly preferably equal to or larger than 120°. If the water contact angle is equal to or larger than 90°, the water stain is difficult to be attached and the stain-proof property is sufficiently presented. In addition, as the water is difficult to be attached, it is expected to prevent ice-accretion.

When the material of the cured resin layer 44 is the hydrophilic material, the water contact angle of the surface of the uneven microstructure is preferably 25° or less, more preferably 23° or less, and particularly preferably 21° or less. If the water contact angle is equal to or less than 25°, the stain attached to the surface may be easily washed away by water and the surface is difficult to have oil stains attached thereto, so that the stain-proof property is sufficiently presented. In order to suppress the increase of reflectivity that occurs with the deformation of the uneven microstructure caused by water absorption of the cured resin layer 44, the water contact angle is preferably equal to or larger than 3°.

(Uses)

The uses of the product 40 may be exemplified as anti-reflection products, anti-fog products, stain-proof products, water-repellent products. More specifically, the product may be exemplified as the antireflection film for the displays, the meter cover of automobiles, the mirror of automobiles, the window of automobiles, emission enhancing elements for organic or inorganic electroluminescent, solar cell members and the like.

(Effects)

According to the producing method of the invention for producing the product having the uneven microstructure on the surface thereof, because the active energy ray curable resin composition includes the internal release agent, the releasability between the cured resin layer and the mold is maintained even if the uneven microstructure of the mold is transferred repeatedly. Moreover, by treating the surface of the mold having the uneven microstructure formed thereon with the external release agent that does not contain the functional group (B) capable of reacting with the functional group (A) existing on the surface, the releasability at the early stage is improved, and what is more, the contamination of the surface of the product due to the transition of the external release agent becomes sufficiently less by comparatively fewer times of transfer. In this way, the product having the uneven microstructure thereon can be produced with good productivity.

Examples

Hereinafter, by way of the examples, the invention is described in details but the invention is not limited to these examples.

(Viscosity)

The viscosity of the active energy ray curable resin composition is measured by the rotary E-type viscometer (manufactured by Toki Sangyo, RE-80R) at 25° C.

(Pores of the Anodic Aluminum Oxide)

A part of the anodized aluminum is cut, and platinum is deposited on the cross-section for one minute. The field emission scanning electronic microscope (manufactured by JEOL, JSM-7400F) is used under the conditions of the accelerating voltage 3.00 kV to observe the cross-section and measure the pore interval and the depth of the pores. Each measurement is performed on 10 points for calculating the average value.

(Protrusions of the Product)

A part of the product is cut, and platinum is deposited on the cross-section for 5 minutes. Similar to the observation of the mold, the cross-section is observed, and the average interval of the protrusions and the height of the protrusions are measured. Each measurement is performed on 10 points for calculating the average value.

(Peel Force)

In the transfer test described below, when the cured resin layer that is formed on the surface of the substrate is released from the mold, the mold is considered as the adhered object and the cured resin layer is considered as an adhesive tape. According to JIS (Japan Industry Standard) Z0237, the 90° peel test is conducted to measure the peel force.

(Resin Residue)

When the cured resin layer that is formed on the surface of the substrate is released from the mold, the cured resin may be adhered to the surface of the mold and all or a part of the mold is in an unworkable state for pattern transfer. The "resin residue" state refers to a situation that the resin adhesion is observed in equal to or more than 10% of the area of the transfer region of the cured resin layer. In addition, the "no resin residue" state refers to that the resin adhesion is observed in less than 10% of the area of the transfer region.

(Transfer Test)

On the side of the mold which is formed with the uneven microstructure, 10 µL of the active energy ray curable resin composition is dropwisely provided to cover the polyethylene terephthalate (hereinafter as PET) film. As soon as the load of 50N is applied, curing is carried out by irradiation with the UV machine (high-pressure mercury lamp with accumulated light energy 1100 mJ/cm$^2$). Then, the cured resin layer along with the PET film are released from the mold to obtain the product having the transferred uneven microstructure on the surface of the PET film.

(Water Contact Angle)

The water contact angle measurement apparatus (DSA10-Mk2 manufactured by Kruss company) is used. On the surface of the mold or product formed with the uneven microstructure, 24 µL of water is dripped. At 10 seconds after the drip, the water contact angle is measured at 10 points at the interval of one second and the average value is determined. In addition, the same operation with the drip position of water changed is performed three times for measurement, and the average value of the four operations is calculated.

(Weighted Average Reflectivity)

After roughening the surface of the product which is not formed with the uneven microstructure, for the sample painted black matte, the spectrophotometer (manufactured by Hitachi, Ltd., U-4000) with an incidence angle of 5° and in the wavelength range of 380-780 nm is used to measure the relative reflectivity of the surface of the cured resin layer.

The weighted average reflectivity is calculated in accordance with JIS R3106. If the weighted average reflectivity is equal to or less than 0.8%, the uneven microstructure can be excellently formed with good transfer precision.

Preparation Example 1

The following compounds are mixed to prepare the base composition A (hydrophobic curing solution, viscosity 80 mPa·s):

TAS: 45 parts by mass of the condensation reaction mixtures of succinic acid/trimethylolethane/acrylic acid in a molar ratio of 1:2:4, C6DA: 45 parts by mass of 1,6-hexanediol diacrylate (manufactured by Osaka Organic Chemical Industry Co., Ltd.), X-22-1602: 10 parts by mass of the free radical polymerizable silicone oil (Shin-Etsu Chemical Industry Co., Ltd.), Irg184: 3.0 parts of 1-hydroxycyclohexyl phenyl ketone (manufactured by Ciba Specialty Chemicals Co., IRGACURE 184), Irg819: 0.2 parts by mass of bis(2,4,6-trimethyl benzoyl)-phenyl phosphine oxide (manufactured by Ciba Specialty Chemicals Co., IRGACURE 819).

Preparation Example 2

The following compounds are mixed to prepare the base composition B (hydrophilic curing solution, viscosity 320 mPa·s):

TAS: 65 parts by mass of the condensation reaction mixtures of succinic acid/trimethylolethane/acrylic acid in a molar ratio of 1:2:4, M260: 30 parts by mass of polyethylene glycol diacrylate (manufactured by Toagosei Co., Ltd., ARONIX M260), MA: 5 parts by mass of methyl acrylate, Irg184: 1.0 parts of 1-hydroxycyclohexyl phenyl ketone (manufactured by Ciba Specialty Chemicals Co., IRGACURE 184), Irg819: 0.1 parts by mass of bis(2,4,6-trimethyl benzoyl)-phenyl phosphine oxide (manufactured by Ciba Specialty Chemicals Co., IRGACURE 819).

Production Example 1

An aluminum plate of 50 mm×50 mm×0.3 mm thickness (99.99% purity) was electro-polished in an electrolytic solution of perchloric acid/ethanol mixture (1/4 volume ratio).

Step (a)

In an aqueous solution of 0.3M oxalic acid, 40V DC, anodic oxidation of the aluminum plate was carried out for 6 hours under the temperature condition of 16° C.

Step (b)

The aluminum plate formed with the oxide film was immersed in an aqueous solution mixed of 6 mass % phosphoric acid/1.8 mass % chromic acid for 3 hours, so that the oxide film was removed.

Step (c)

In an aqueous solution of 0.3M oxalic acid, 40V DC, anodic oxidation of the aluminum plate was carried out for 30 seconds under the temperature condition of 16° C.

Step (d)

The aluminum plate formed with the oxide film was immersed in an aqueous solution of 5 mass % phosphoric acid for 8 minutes at 32° C., so as to perform the pore expanding process.

Step (e)

In an aqueous solution of 0.3M oxalic acid, 40V DC, anodic oxidation of the aluminum plate was carried out for 30 seconds under the temperature condition of 16° C.

Step (f)

The previous Step (d) and Step (e) are repeatedly performed for 5 times, so as to obtain the mold a having anodized aluminum formed on the surface thereof, wherein the anodized aluminum has the slightly cone-shaped pores with the average interval of the pores being 100 nm and the pore depth being 230 nm.

Example 1

Step (g)

The shower was used to lightly wash away the phosphoric acid solution on the surface of the mold a, and the mold a was then immersed in the flowing water for 10 minutes.

Step (h)

The air gun was used to blow the air to the mold a so as to remove the water droplets attached on the surface of the mold a.

Step (i)

The compound (manufactured by Solvay Solexis Co., FLUOROLINKL) that does not contain the functional group (B) capable of reacting with the hydroxyl groups existing on the surface of the mold a but contain the perfluoropolyether structure was prepared and used as the external release agent.

The mold a was immersed in the dilution solution of the external release agent (manufactured by Solvay Solexis Co., FLUOROLINKL) obtained by diluting to 0.1 mass % with the dilution agent (manufactured by Solvay Solexis Co., H-GALDEN ZV130) at the room temperature for 10 minutes.

Step (j)

The mold a was withdrawn out at 3 mm/sec from the dilution solution.

Step (k)

The mold a was air dried overnight and the mold a that has been treated with the release agent is obtained.

The water contact angle of the surface of the mold a formed with the uneven microstructure thereon was about 135°.

Relative to 100 parts by mass of the polymerizable compounds, 0.1 parts by mass of the internal release agent (manufactured by Nikko Chemicals Co., Ltd., TLP-4, of formula (1) whereas $R^1$=an alkyl with 12 carbon atoms, n=3, m=4) was added to the base composition A to prepare the active energy ray curable resin composition.

The mold a was used for the transfer test to evaluate the releasability by means of the peel force and resin residue. In addition, the water contact angle and the weighted average reflectivity (transferred at the $1000^{th}$ times) of the obtained product were measured, and the results are shown in Table 1.

Example 2

The amount of the internal release agent (TLP-4) was changed to 0.3 parts by mass relative to 100 parts by mass of the polymerizable compounds, while other conditions were maintained the same as Example 1 to evaluate the releasability. In addition, the water contact angle and the weighted average reflectivity of the obtained product were measured based on the same conditions as Example 1, and the results are shown in Table 1.

Example 3

The base composition A was changed to the base composition B while other conditions were maintained the same as Example 1 to evaluate the releasability. In addition, the water contact angle and the weighted average reflectivity of the obtained product were measured, and the results are shown in Table 1.

Example 4

The external release agent was changed to the compound having the terminal structure of —$CH_2OH$, FLUOROLINK D10/H (manufactured by Solvay Solexis Co.) while other conditions were maintained the same as Example 1 to evaluate the releasability. In addition, the water contact angle, the weighted average reflectivity and the peel force of the obtained product were measured based on the same conditions as Example 1, and the results are shown in Table 1.

Example 5

The external release agent was changed to the compound having the terminal structure of —$CH_2(OCH_2CH_2)_nOH$, FLUOROLINK E10/H (manufactured by Solvay Solexis Co.) while other conditions were maintained the same as Example 1 to evaluate the releasability. In addition, the water contact angle, the weighted average reflectivity and the peel force of the obtained product were measured based on the same conditions as Example 1, and the results are shown in Table 1.

Comparative Example 1

The external release agent was changed to the fluorocompound having a hydrolyzable silyl group (manufactured by Daikin Industries, Ltd. OPTOOL DSX) that was capable of reacting with the hydroxyl groups existing on the surface of the mold a while other conditions were maintained the same as Example 1 to evaluate the releasability. In addition, the water contact angle and the weighted average reflectivity of the obtained product were measured based on the same conditions as Example 1, and the results are shown in Table 1.

Comparative Example 2

Except that the internal release agent was not used, the other conditions were maintained the same as Example 1 to evaluate the releasability. The results are shown in Table 1.

Comparative Example 3

Except that the internal release agent was not used, the other conditions were maintained the same as Example 3 to evaluate the releasability. The results are shown in Table 1.

Comparative Example 4

Except that the external release agent was not used, the other conditions were maintained the same as Example 1 to evaluate the releasability. The results are shown in Table 1.

Comparative Example 5

The amount of the internal release agent (TLP-4) was changed to 0.5 parts by mass relative to 100 parts by mass of the polymerizable compounds while other conditions were maintained the same as Example 1 to evaluate the releasability. The results are shown in Table 1.

TABLE 1

| | | | external release agent | internal release agent | | water contact angle of the transferred product[°] | | | |
|---|---|---|---|---|---|---|---|---|---|
| | | base composition | name | name | addition amount [parts by mass] | 1st | 80th | 120th | 200th |
| Example | 1 | A: hydrophobic | FLUOROLINK L | TLP-4 | 0.1 | 141 | 138 | 135 | 135 |
| | 2 | A: hydrophobic | FLUOROLINK L | TLP-4 | 0.3 | 140 | 137 | 134 | 133 |
| | 3 | B: hydrophilic | FLUOROLINK L | TLP-4 | 0.1 | 28 | 20 | 18 | 17 |
| | 4 | A: hydrophobic | FLUOROLINK D10/H | TLP-4 | 0.1 | 139 | 139 | 134 | 133 |
| | 5 | A: hydrophobic | FLUOROLINK E10/H | TLP-4 | 0.1 | 139 | 138 | 133 | 133 |

TABLE 1-continued

| | | | base composition | | | | | | |
|---|---|---|---|---|---|---|---|---|---|
| Comparative example | 1 | A: hydrophobic | OPTOOL DSX | TLP-4 | 0.1 | 142 | 142 | 141 | 139 |
| | 2 | A: hydrophobic | FLUOROLINK L | — | — | 143 | 138 | 134 | resin residue at 150th (mold release not viable) |
| | 3 | B: hydrophilic | FLUOROLINK L | — | — | 23 | 20 | 18 | 18 |
| | 4 | A: hydrophobic | — | TLP-4 | 0.1 | resin residue | — | — | — |
| | 5 | A: hydrophobic | — | TLP-4 | 0.5 | resin residue | — | — | — |

| | | | water contact angle of the transferred product[°] | | peel force for releasing mold[N/m] | | | weighted average reflectivity |
|---|---|---|---|---|---|---|---|---|
| | | base composition | 400th | 1000th | 1st | 120th | 1000th | [%] |
| Example | 1 | A: hydrophobic | 135 | 135 | 13 | 9 | 9 | 0.4 |
| | 2 | A: hydrophobic | 134 | 135 | 12 | 10 | 10 | 0.4 |
| | 3 | B: hydrophilic | 17 | 17 | 14 | 12 | 11 | 0.4 |
| | 4 | A: hydrophobic | 134 | 134 | 14 | 10 | 10 | 0.4 |
| | 5 | A: hydrophobic | 134 | 134 | 8 | 9 | 10 | 0.4 |
| Comparative example | 1 | A: hydrophobic | 135 | 135 | 4 | 5 | 5 | 0.4 |
| | 2 | A: hydrophobic | — | — | 13 | 32 | resin residue at 150$^{th}$ (mold release not viable) | — |
| | 3 | B: hydrophilic | resin residue at 230th (mold release not viable) | — | 14 | 70 | resin residue at 230th (mold release not viable) | — |
| | 4 | A: hydrophobic | — | — | resin residue | — | — | — |
| | 5 | A: hydrophobic | — | — | resin residue | — | — | — |

For Example 1-Example 5, the peel force for releasing the cured resin layer from the mold was small at the early stage of the transfer as well as at the 1000$^{th}$ times of the transfer, the release was easy, and no resin residue on the mold was observed.

For Comparative example 1-Comparative example 3, the peel force for releasing the cured resin layer from the mold was small at the early stage of the transfer, the release was easy, and no resin residue on the mold was observed. However, the peel force became larger before the 1000$^{th}$ times of the transfer, and resin residue on the mold was observed.

For Comparative example 4-Comparative example 5, resin residue was observed on the mold at the early stage of the transfer.

Figure 4:
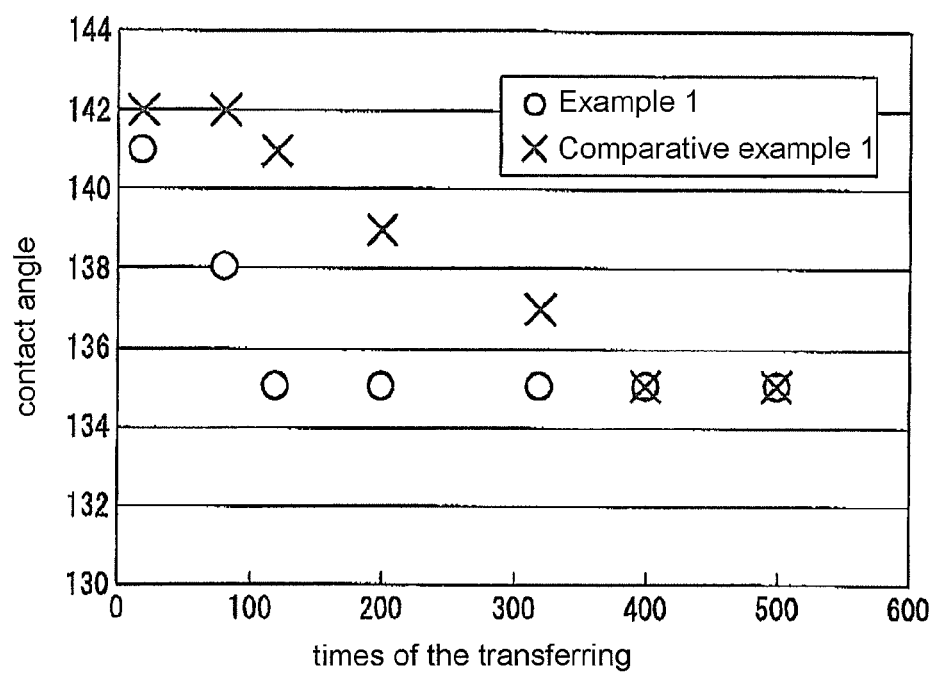
FIG. 4 is a graph showing the relation between the number of times of transferring the uneven microstructure of the mold and a water contact angle of the surface of the product with the uneven microstructure.

Additionally, regarding the products obtained in Example 1 and Comparative example 1, the relation between the number of times of transferring the uneven microstructure of the mold and the water contact angle of the surface of the product transferred with the uneven microstructure is shown in FIG. 4. For Comparative example 1, up to 400 times of the transfer, the contact angle gradually decreased. The reasons lay in that the external release agent pre-coated on the mold was transited to the surface of the product through the transfer. In that case, the materials such as the base film and the resin composition that were consumed before the surface properties of the obtained product become stabilized were wasted. On the other hand, for Example 1, after the 120$^{th}$ times of the transfer, it was not observed that the contact angle was lowered. As described previously, based on Example 1, the contact angle as one of the surface properties was stabilized earlier. That was, the product with stabilized surface properties was obtained with fewer times of the transfer from the beginning of the transfer. Furthermore, similar to Example 1, in Example 2 and Example 3, the products with stabilized contact angles were obtained with fewer times of the transfer from the beginning of the transfer.

According to the previous descriptions, in Example 1-Example 3, by using the reactive energy ray curable resin composition containing the internal release agent in combination with the mold treated with the external release agent that does not contain the functional group (B) capable of reacting with the functional group (A) existing on the surface of the mold, there is no resin residue on the mold when transferring the uneven microstructure to the product surface even the transfer is performed with one single mold for 1000 times, and the releasability between the mold and the cured resin layer remains excellent. In addition, the product with stabilized surface properties is obtained at relatively fewer times of transfer. Moreover, no matter the reactive energy ray curable resin composition is hydrophobic or hydrophilic, the improvement of the releasability is achieved and the flexibility in the design of the resin is high. From the observation of the shape of the protrusions of the transferred uneven microstructure, the protrusions are slightly cone shaped with the average interval of the protrusions being 100 nm and height being 220 nm, and the shape of the mold is excellently transferred with high accuracy accuracy.

The method for producing the product having the uneven microstructure on the surface thereof, as disclosed in this invention, is applicable to achieving efficient mass production of antireflection products, anti-fog products, stain-proof products, and water-repellent products.

What is claimed is:

1. A method for producing a product having an uneven microstructure on a surface thereof, the producing method comprising the following steps (I)-(II):

step (I) treating a surface of a mold having an uneven microstructure thereon with an external release agent containing a fluorine and not containing a functional group (B) which forms a chemical bond with a functional group (A) existing on the surface, wherein the functional group (B) is replaced with ester, alkyl or ether groups on the external release agent, and when the functional group (A) is hydroxyl, the functional group (B) is selected from a hydrolyzable silyl group, silanol groups, a hydrolyzable group containing a titanium atom or an aluminum atom, wherein the external release agent is not coming from previous printing steps; and step (II), after the step (I), inserting an active energy ray curable resin composition containing an internal release agent between the mold and a substrate, irradiating the active energy ray curable resin composition with an active energy ray to harden the active energy ray curable resin composition, so as to form a cured resin layer, onto which the uneven microstructure is transferred, on a surface of the substrate and to obtain the product having the uneven microstructure on the surface thereof, wherein the internal release agent is poly(oxyethylene) alkyl phosphate ester.

2. The producing method of claim 1, wherein the external release agent is a compound having a perfluoropolyether structure.

3. The producing method of claim 2, wherein the uneven microstructure of the surface of the mold is formed of anodized aluminum.

4. The producing method of claim 1, wherein the uneven microstructure of the surface of the mold is formed of anodized aluminum.

5. The producing method of claim 1, wherein the functional group (A) is at least one selected from the group consisting of a hydroxyl group, an amino group, a carboxyl group, a mercapto group, an epoxy group and an ester group.

6. The producing method of claim 1, wherein the external release agent is a compound having a perfluoropolyether structure.

7. The producing method of claim 1, wherein the uneven microstructure of the surface of the mold is formed of anodized aluminum.

* * * * *